US006975116B2

(12) United States Patent  
McKinnon

(10) Patent No.: US 6,975,116 B2  
(45) Date of Patent: Dec. 13, 2005

(54) METHOD AND APPARATUS FOR MULTIPLE FIELD OF VIEW GRADIENT COILS

(75) Inventor: Graeme Colin McKinnon, Hartland, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/722,975

(22) Filed: Nov. 26, 2003

(65) Prior Publication Data

US 2005/0110486 A1 May 26, 2005

(51) Int. Cl.⁷ .............................................. G01V 3/00
(52) U.S. Cl. ..................... 324/318; 600/421
(58) Field of Search ............................ 324/318, 322, 324/306, 307, 309; 600/421, 422

(56) References Cited

U.S. PATENT DOCUMENTS

| | | | |
|---|---|---|---|
| 5,311,135 A * | 5/1994 | Vavrek et al. ............... | 324/318 |
| 5,320,103 A | 6/1994 | Rapoport et al. | |
| 5,378,988 A | 1/1995 | Pulyer | |
| 5,406,205 A | 4/1995 | Muller | |
| 5,462,054 A | 10/1995 | Rapoport et al. | |
| 5,633,587 A | 5/1997 | Hirumachi | |
| 5,659,281 A | 8/1997 | Pissanetzky et al. | |
| 5,696,449 A | 12/1997 | Boskamp | |
| 5,713,359 A | 2/1998 | Dumoulin et al. | |
| 5,774,034 A | 6/1998 | Yoneda et al. | |
| 5,814,993 A | 9/1998 | Frese et al. | |
| 6,150,911 A | 11/2000 | Katznelson et al. | |
| 6,252,405 B1 | 6/2001 | Watkins et al. | |
| 6,479,999 B1 | 11/2002 | DeMeester et al. | |
| 6,515,479 B1 * | 2/2003 | Arz et al. .................... | 324/318 |
| 6,630,829 B1 | 10/2003 | Liu | |
| 6,680,612 B1 * | 1/2004 | McKinnon et al. .......... | 324/318 |
| 6,703,835 B2 | 3/2004 | Patch et al. | |
| 6,788,055 B2 | 9/2004 | McKinnon et al. | |
| 2002/0171424 A1 | 11/2002 | Morich et al. | |
| 2004/0075434 A1 | 4/2004 | Vavrek et al. | |

OTHER PUBLICATIONS

R. Killingen, M. Gebhardt, J. Schuster, M. Brand, F. Schmitt, A. Haase; Gradient System Providing Continuously Variable Field Characteristics; "Magnetic Resonance in Medicine"; 2002; pp. 800-808; vol. 47: Wiley-Liss. Inc.

P. Harvey, E, Katznelson; Modular Gradient Coil: A New Concept in High-Peformance Whole-Body Gradient Coil Design; "Magnetic Resonance in Medicine"; 1999; pp. 561-570; vol. 42; Wiley-Liss, Inc.

* cited by examiner

Primary Examiner—Louis Arana  
(74) Attorney, Agent, or Firm—Carl B. Horton, Esq.; Armstrong Teasdale LLP

(57) ABSTRACT

A method of operating a magnetic resonance imaging system having a first coil and a second coil to achieve an imaging volume includes, in a first mode, achieving the imaging volume by using a sum field from both of the coils, and, in a second mode, achieving the imaging volume by using a difference field from both of the coils.

11 Claims, 1 Drawing Sheet

METHOD AND APPARATUS FOR MULTIPLE FIELD OF VIEW GRADIENT COILS

BACKGROUND OF THE INVENTION

This invention relates generally to magnetic resonance and, more particularly, to methods and systems for generating an image from a multiple field of view gradient coil utilizing a sum and difference approach.

Magnetic resonance imaging systems include gradient coils to generate linear magnetic field gradients which are used for spatial encoding. Gradient coils are typically designed to optimize strength, slewrate, and useful imaging volume. The imaging speed of a gradient coil is roughly proportional to the product of strength and slewrate. Generally, the larger the useful imaging volume, the lower the imaging speed. Hence coils designed for whole body imaging perform less than optimally for lower volume applications, such as, for example, a head application.

Dual field of view gradient coils were introduced in an attempt to overcome this difficulty. In dual field of view gradient coils, a set of two or more electrically separate windings is provided for each gradient axis and a single set of windings can be switched to operate in two or more different modes, whereby one mode provides a higher imaging speed over a small imaging volume, compared to the other mode which provides for a larger imaging volume at a lower imaging speed.

Dual field of view coils, however, do not attain the performance provided by single coils optimized for a given imaging volume, due to the physical space requirements of the primary and shield windings. Imaging efficiency is the imaging speed (strength times slewrate) divided by the current times the voltage provided by the gradient amplifier, for a given imaging volume. The larger the separation between the primary and shield windings, the higher the imaging efficiency.

There have been many attempts at determining the optimal dual field of view coil topology that provides the best imaging efficiency. One approach to optimize the dual field of view coil topology uses single primary and shield formers, and creates two or more switchable circuits on the surface of each former. A problem with this approach is the reduced flexibility with respect to optimizing the field linearity, or alternatively the difficulty in constructing the multiple conductor crossovers.

A second approach uses two separate sets of primary and shield coils. One set of primary and shield coils provides for one imaging volume, and the other set of primary and shield coils provides for another imaging volume. A problem with this approach is that either one set of coils is very inefficient, or both sets are moderately inefficient. This approach is commonly known as the "twin" configuration.

Recently, a "main plus corrector" approach has been developed. In the main plus corrector approach, one coil (the main coil) is used for both imaging volumes, and the other coil (the corrector coil) is used to increase the imaging volume. Hence the small imaging volume is achieved with the main coil alone, and the large imaging volume is achieved with the main coil and the corrector coil operating simultaneously. This approach offers improved imaging efficiency over using two separate sets of coils for each volume. However, in the main plus corrector configuration, the gain (gradient strength per unit current) of both volumes is determined by the gain of the main coil which can be problematic because typically one would prefer to have the smaller imaging volume configuration operate at a higher gain than the larger imaging volume configuration.

BRIEF DESCRIPTION OF THE INVENTION

In one aspect, a method of operating a magnetic resonance imaging system having a first coil and a second coil to achieve an imaging volume is provided. The method includes, in a first mode, achieving the imaging volume by using a sum field from both of the coils, and, in a second mode, achieving the imaging volume by using a difference field from both of the coils.

In another aspect, a magnetic resonance imaging (MRI) system is provided. The system includes at least one first coil, and at least one second coil electromagnetically coupled to the first coil. The imaging system is configured to operate in a first mode to obtain an imaging volume by using a sum field from the first coil and the second coil, and operate in a second mode to obtain an imaging volume by using a difference field from the first coil and the second coil.

In still another aspect, a method of imaging an object utilizing a magnetic resonance system is provided. The method includes imaging a first volume using a sum field from a first coil and a second coil, and imaging a second volume using a difference field from the first coil and the second coil.

In yet another aspect, a computer readable medium is provided. The medium is encoded with a program configured to instruct a computer to energize a first coil and a second coil in a first mode to obtain an imaging volume by using a sum field from the first coil and the second coil, and energize the first coil and the second coil in a second mode to obtain an imaging volume by using a difference field from the first coil and the second coil.

In another aspect, a computer is provided. The computer is configured to receive a mode indication including a small mode and a large mode, energize a first coil and a second coil in a first mode to obtain an imaging volume by using a sum field from the first coil and the second coil when the indication is large mode, and energize the first coil and the second coil in a second mode to obtain an imaging volume by using a difference field from the first coil and the second coil when the indication is small mode.

DETAILED DESCRIPTION OF THE INVENTION

Figure 1:
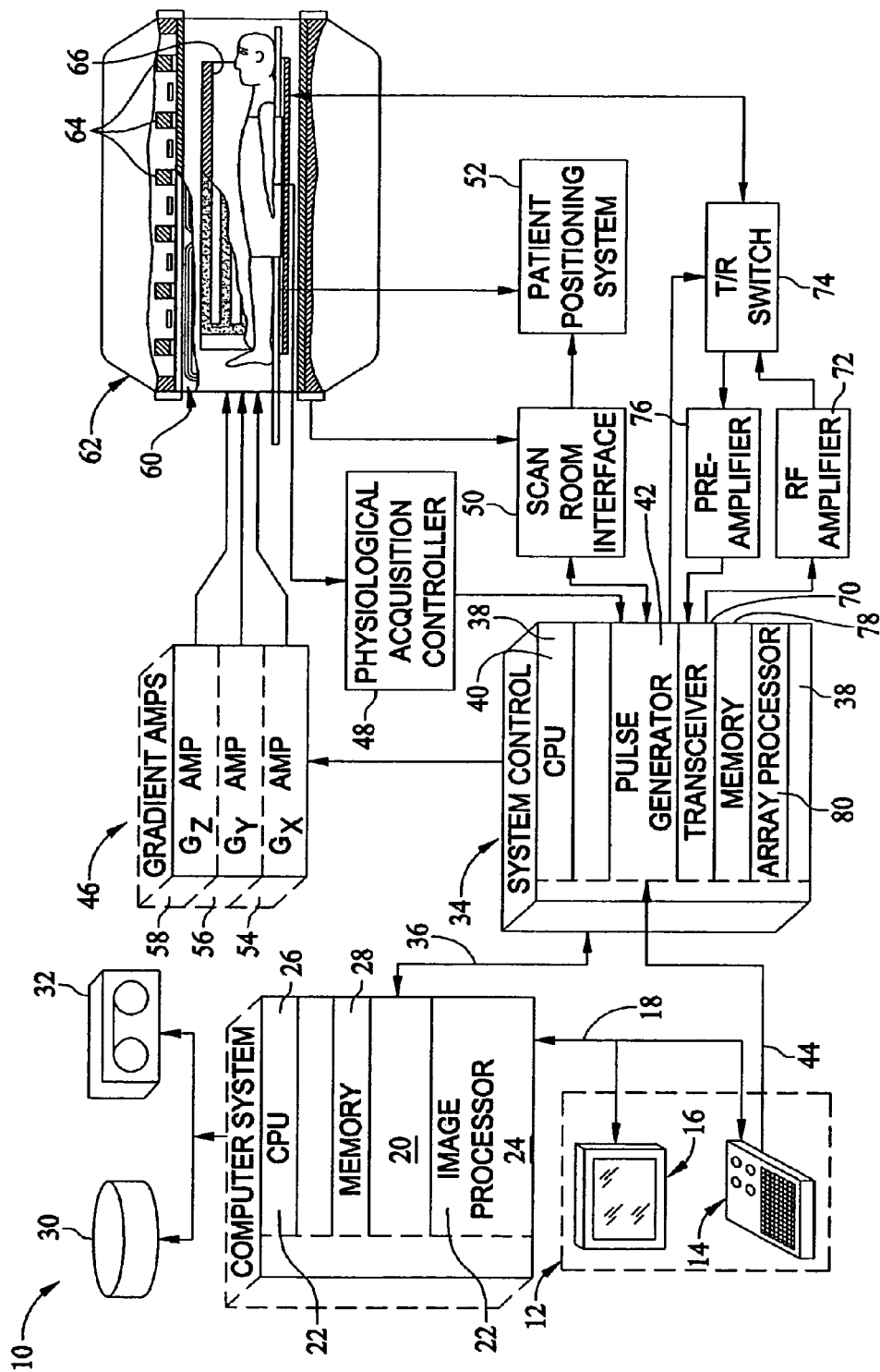
FIG. 1 is a block schematic diagram of a Magnetic Resonance Imaging (MRI) system.

Herein described are methods and apparatus which utilize a sum and difference approach for dual field of view gradient coils used in MRI and NMR magnetic field generators. Two windings are utilized for each axis and both windings are used for both the small imaging volume and the large imaging volume. However in one mode the magnetic fields from one of the coils is reversed. More specifically, in a first mode, the imaging volume is achieved by using the sum field from both coils and in a second mode, the imaging volume is achieved by using the difference field from both coils.

As used herein, an element or step recited in the singular and preceded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features. Additionally, a reference to a main coil contemplates a plurality of coils, and therefore the terms main coil and main coils are used interchangeably herein. For the same reason, the terms shield coil and shield coils are also interchangeably herein.

FIG. 1 is a block diagram of an embodiment of a magnetic resonance imaging (MRI) system 10 in which the herein described systems and methods are implemented. MRI 10 includes an operator console 12 which includes a keyboard and control panel 14 and a display 16. Operator console 12 communicates through a link 18 with a separate computer system 20 thereby enabling an operator to control the production and display of images on screen 16. Computer system 20 includes a plurality of modules 22 which communicate with each other through a backplane. In the exemplary embodiment, modules 22 include an image processor module 24, a CPU module 26 and a memory module 28, also referred to herein as a frame buffer for storing image data arrays. Computer system 20 is linked to a disk storage unit 30 and a tape drive 32 to facilitate storing image data and programs. Computer system 20 communicates with a separate system control 34 through a high speed serial link 36.

System control 34 includes a plurality of modules 38 electrically coupled using a backplane (not shown). In the exemplary embodiment, modules 38 include a CPU module 40 and a pulse generator module 42 that is electrically coupled to operator console 12 using a serial link 44. Link 44 facilitates transmitting and receiving commands between operator console 12 and system control 34 thereby allowing the operator to input a scan sequence that system 10 is to perform. Pulse generator module 42 directs the system components to carry out the desired scan sequence, and generates data indicative of the timing, strength and shape of the RF pulses which are to be produced, and the timing of, and length of, a data acquisition window. Pulse generator module 42 is electrically coupled to a gradient amplifier system 46 and provides gradient amplifier system 46 with a signal indicative of the timing and shape of the gradient pulses to be generated during the scan. Pulse generator module 42 is also configured to receive patient data from a physiological acquisition controller 48. In the exemplary embodiment, physiological acquisition controller 48 is configured to receive inputs from a plurality of sensors indicative of a physiological condition of a patient such as, but not limited to, ECG signals from electrodes attached to the patient. Pulse generator module 42 is electrically coupled to a scan room interface circuit 50 which is configured to receive signals from various sensors indicative of the patient condition and the magnet system. Scan room interface circuit 50 is also configured to transmit command signals such as, but not limited to, a command signal to move the patient to a desired position, to a patient positioning system 52.

The gradient waveforms generated by pulse generator module 42 are input to gradient amplifier system 46 including a $G_x$ amplifier 54, a $G_y$ amplifier 56, and a $G_z$ amplifier 58. Amplifiers 54, 56, and 58 each excite a corresponding gradient coil in gradient coil assembly 60 to generate a plurality of magnetic field gradients used for position encoding acquired signals. In the exemplary embodiment, gradient coil assembly 60 includes a magnet assembly 62 that includes a polarizing magnet 64 and a whole-body RF coil 66.

In use, a transceiver module 70 positioned in system control 34 generates a plurality of electrical pulses which are amplified by an RF amplifier 72 that is electrically coupled to RF coil 66 using a transmit/receive switch 74. The resulting signals radiated by the excited nuclei in the patient are sensed by RF coil 66 and transmitted to a preamplifier 76 through transmit/receive switch 74. The amplified NMR (nuclear magnetic resonance) signals are then demodulated, filtered, and digitized in a receiver section of transceiver 70. Transmit/receive switch 74 is controlled by a signal from pulse generator module 42 to electrically connect RF amplifier 72 to coil 66 during the transmit mode and to connect preamplifier 76 during the receive mode. Transmit/receive switch 74 also enables a separate RF coil (for example, a surface coil) to be used in either a transmit or a receive mode.

The NMR signals received by RF coil 66 are digitized by transceiver module 70 and transferred to a memory module 78 in system control 34. When the scan is completed an array of raw k-space data has been acquired in memory module 78. The raw k-space data is rearranged into separate k-space data arrays for each cardiac phase image to be reconstructed, and each of these data arrays is input to an array processor 80 configured to Fourier transform the data into an array of image data. This image data is transmitted through serial link 36 to computer system 20 where it is stored in disk memory 30. In response to commands received from operator console 12, in one embodiment, this image data is archived on tape drive 32, and in a second embodiment, it is further processed by image processor 24, transmitted to operator console 12 and presented on display 16.

In an example embodiment, two windings, or coils, are utilized for each axis, similar to a main plus corrector configuration. However, unlike the main plus corrector configuration, both windings are used for both the small imaging volume and the large imaging volume since, in one mode, the magnetic fields from one of the coils is reversed. For this example, the desired field for the small imaging volume is B1, and the desired field for the large imaging volume is B2. Furthermore, the field from the first coil is denoted as C1 and the field from the second coil is denoted as C2. Then C1 and C2 are chosen such that C1+C2=B1, and C1−C2=B2. In other words one imaging volume is achieved by using the sum field from both coils, and the other imaging volume is achieved by using the difference field from both coils. In this example, the term "coil" is used to include both the primary and shield coils. Thus, although only two coils are referenced above, there are actually two sets of two coils.

An advantage of this "sum and difference" configuration is that the effective gains for the fields B1 and B2 don't have to be the same. Hence there is much more flexibility in configuring the performance for the two different imaging volumes. And, even though the inductance in the small field of view mode is increased over the main plus corrector topology, by adjusting the gain ratio between B1 and B2 this increase can be made very slight. A further advantage over the main plus corrector configuration is that the large field of view coil has a lower resistance. Hence the sum and difference configuration allows one to better trade off heating losses between the small and large imaging volume modes.

There are many ways to configure the current density required for coils C1 and C2. An example configuration is as follows:

(1) Let P1, P2, S1, S2 be the primary and shield radii for coils #1 and #2 respectively. Also let P1<P2<S1<S2.

(2) The current density is obtained for a small imaging volume coil by assuming that the primary and shield radii are P2 and S1 respectively. This current density is then denoted by D1.

(3) The current density is obtained for a large imaging volume coil by assuming that the primary and shield radii are P2 and S2 respectively. This current density is then denoted by D2.

(4) The initial current density for coil C1 is given by E1=0.5*(D1+D2).

(5) The initial current density for coil C2 is given by E2=0.5*(D1−D2).

(6) The current density E1 (for coil 1), is then defined for the radii P2 and S1. This current density E1 is then transformed to an equivalent current density E1' at the radii P1 and S1. This transformation can be performed analytically using the procedure described below.

The current density for the coil is transformed into an equivalent current density for a cylinder with a different radius. Transforming current density patterns uses the same mathematics as used in determining the optimal shield current; and is based on a cylindrical harmonic expansion of the field produced from a given cylindrical current density. Most of the theory is described in Jianming Jin's book "Electromagnetic Analysis and Design in Magnetic Resonance Imaging", CRC Press, 1999.

Theory

If the mth Fourier component, in the z direction, of the azimuthal current density over a cylinder of radius a, is $$j_\phi^m(k) = \int_{-\infty}^{\infty} \sum_{m=-\infty}^{m=\infty} e^{-im\phi} e^{-ikz} J_\phi(\phi, z) dz, \quad [1]$$

then the z component of the field within the cylinder is $$B_z(\rho, \phi, z) = -\frac{\mu_0 a}{2\pi} \int_{-\infty}^{\infty} \sum_{m=-\infty}^{m=\infty} e^{im\phi} e^{ikz} |k| j_\phi^m(k) I_m(|k|\rho) K_m'(|k|a) dk. \quad [2]$$

The shielding condition, for a shield with radius b, is $$b j_{b\phi}^m(k) I_m'(|k|b) = -a j_{a\phi}^m(k) I_m'(|k|a). \quad [3]$$

The field from a shielded coil is obtained by setting $$a j_\phi^m(k) K_m'(|k|a) \to a j_{a\phi}^m(k) K_m'(|k|a) + b j_{b\phi}^m(k) K'(|k|b) \quad [4]$$

in Eq. 2.

Using Eq. 3, the right hand side can be written as $$a j_{a\phi}^m(k) \left( K_m'(|k|a) - K'(|k|b) \frac{I_m'(|k|a)}{I_m'(|k|b)} \right). \quad [5]$$

To transform a gradient coil from a primary and shield winding with radii a and b, respectively, to one which has the primary and shield winding at radii c and d, respectively, then the condition for the primary current density on the new radius, such that the internal field is the same is $$c j_{c\phi}^m(k) \left( K_m'(|k|c) - K'(|k|d) \frac{I_m'(|k|c)}{I_m'(|k|d)} \right) = \quad [6]$$
$$a j_{a\phi}^m(k) \left( K_m'(|k|a) - K'(|k|b) \frac{I_m'(|k|a)}{I_m'(|k|b)} \right).$$

This transformation can be performed without changing the field within the coil.

Operator console 12 linked with computer system 20 enables an operator to select which mode to use in the production and display of images on screen 16. Computer system 20 receives the selection and energizes the coils based on the mode chosen. If the operator chooses the large imaging volume mode, computer system 20 receives the selection, and energizes a first coil and a second coil to obtain an imaging volume by using a sum field from the first coil and the second coil. If the operator chooses the small imaging volume mode, computer system 20 receives the instruction, and energizes the first coil and the second coil to obtain an imaging volume by using a difference field from the first coil and the second coil.

Thus a method and system are described that provide a sum and difference approach for use with dual field of view gradient coils. Although only dual field of view gradient coils are described above, it is to be understood that the benefits associated with this approach would apply equally well to gradient coils having more than two fields of view.

Accordingly, the herein described methods and apparatus provide for efficient switching of imaging volumes in a cost effective manner. One technical effect of the herein described methods and apparatus is that the herein described methods and apparatus offer improved imaging efficiency over using two separate sets of coils for each volume.

While the invention has been described in terms of various specific embodiments, those skilled in the art will recognize that the invention can be practiced with modification within the spirit and scope of the claims.

What is claimed is:

1. A method of operating a magnetic resonance imaging system having a first coil and a second coil to achieve an imaging volume, said method comprising:
   in a first mode, achieving the imaging volume by using a sum field from both of the coils; and
   in a second mode, achieving the imaging volume by using a difference field from both of the coil,
   wherein P1 and S1 are primary and shield radii for the first coil, P2 and S2 are primary and shield radii for the second coil, and P1<P2<S1<S2, said method comprising achieving the current density for a small imaging volume coil by assuming that the primary and shield radii are P2 and S1 respectively and denoting the current density by D1.

2. A method in accordance with claim 1 further comprising achieving the current density for a large imaging volume coil by assuming that the primary and shield radii are P2 and S2 respectively and denoting the current density by D2.

3. A method in accordance with claim 2 further comprising denoting the initial current density for coil C1 by E1=0.5*(D1+D2).

4. A method in accordance with claim 2 further comprising denoting the initial current density for coil C2 by E2=0.5*(D1−D2).

5. A method in accordance with claim 4 further comprising transforming a current density for coil C2, at radius P2, to radius P1, such that an internal field of coil C2 is unchanged.

6. A magnetic resonance imaging (MRI) system comprising:
   at least one first coil; and
   at least one second coil electromagnetically coupled to said first coil;
   said imaging system configured to:
      operate in a first mode to obtain a small imaging volume by using a sum field from said first coil and said second coil; and
      operate in a second mode to obtain a large imaging volume by using a difference field from said first coil and said second coil;
   wherein P1 and S1 are primary and shield radii for said first coil, P2 and S2 are primary and shield radii for said second coil, and P1<P2<S1<S2, the current density is achieved for a small imaging volume coil by assuming that the primary and shield radii are P2 and S1 respectively and denoting the current density by D1.

7. A system in accordance with claim 6 further comprising achieving the current density for a large imaging volume coil by assuming that the primary and shield radii are P2 and S2 respectively and denoting the current density by D2.

8. A system in accordance with claim 7 further comprising denoting the initial current density for coil C1 by E1=0.5*(D1+D2).

9. A system in accordance with claim 7 further comprising denoting the initial current density for coil C2 by E2=0.5*(D1−D2).

10. A method of imaging an object utilizing a magnetic resonance system, said method comprising:
   imaging a first volume using a sum field from a first coil and a second coil; and
   imaging a second volume using a difference field from the first coil and the second coil, including reversing the magnetic field of the second coil to switch from the sum field to the difference field,
   wherein a field for the first imaged volume is B1, and a field for the second imaged volume is B2, a field from the first coil is denoted as C1 and a field from the second coil is denoted as C2, said method comprising selecting C1 and C2 such that C1+C=B1, and C1−C2=B2;
   and further wherein P1 and S1 are primary and shield radii for the first coil, P2 and S2 are primary and shield radii for the second coil, and P1<P2<S1<S2,
   and said method further comprising achieving the current density for the first imaged volume coil by assuming that the primary and shield radii are P2 and S1 respectively and denoting the current density by D1.

11. A method in accordance with claim 10 further comprising achieving the current density for the second imaged volume coil by assuming that the primary and shield radii are P2 and S2 respectively and denoting the current density by D2.

* * * * *